United States Patent
Mou et al.

[19]

[11] Patent Number: 6,051,067
[45] Date of Patent: Apr. 18, 2000

[54] WAFER SECURING DEVICE AND METHOD

[75] Inventors: Michael Mou, Tu-Cheng; Bill Yuan Chung Chuang, Hsinchu; Arnold Chang Mou Yang; Jing Yuang Ho, both of Hsinchu Hsien, all of Taiwan

[73] Assignee: Microjet Technology Co., Ltd., Hsinch Hsien, Taiwan

[21] Appl. No.: 09/064,624

[22] Filed: Apr. 23, 1998

[51] Int. Cl.[7] .............................. B05C 13/00; B25B 11/00
[52] U.S. Cl. .......................... 118/500; 269/21; 211/41.18
[58] Field of Search ..................................... 118/500, 503, 118/728; 269/21, 903, 305; 211/41.8; 206/454, 832, 833, 710, 711; 392/418; 219/410, 417

[56] References Cited

U.S. PATENT DOCUMENTS 4,131,267  12/1978  Ono et al. .................................. 269/21
4,603,466  8/1986  Morley ................................. 29/569 R
5,436,693  7/1995  Marumo ..................................... 355/73

*Primary Examiner*—Laura Edwards
*Assistant Examiner*—George R. Koch, III
*Attorney, Agent, or Firm*—Rosenberg, Klein & Lee

[57] ABSTRACT

A wafer securing device and method for securing a planar plate on a wafer having a hollowed-out portion, the device including a substrate for receiving the wafer; a groove provided on the substrate and having an opening, the hollowed-out portion corresponding to the groove when the wafer is placed on the substrate; and an air extracting equipment for extracting air from the groove when the wafer is placed on the substrate so that the planar plate placed on the wafer is secured to the wafer by means of a vacuum suction force.

7 Claims, 5 Drawing Sheets

WAFER SECURING DEVICE AND METHOD

BACKGROUND OF THE INVENTION

1. Field of the Invention

The present invention relates generally to a wafer securing device and method, and more particularly to a wafer securing device and method utilizing vacuum suction force to secure a planar plate on a wafer.

2. Description of the Prior Art

In semi-conductor manufacturing processes, it is often necessary to secure the relative positions of two chips in order to proceed with the subsequent steps. If it is desirable to adhere a planar plate to a wafer, the steps are: (1) coating the wafer with an adhesive; (2) placing the planar plate on the wafer; (3) securing the planar plate and the wafer; (4) transferring the secured wafer and planar plate to a heating plate for heating and pressure application; and (5) removing the securing device. With the fast advancement in the making of semi-conductors, the degree of integration is becoming more and more important. The distance between elements and elements is gradually reduced. Hence, the securing step becomes very important. When the planar plate is placed on the wafer by precision positioning, any improper securing will result in displacement during the transfer process so that the elements can no longer be used, which will increase faulty product rate.

One conventional securing method is to utilize a clamping device. Referring to FIG. 1, which is a schematic view of the prior method of securing the wafer, a planar plate 2 is placed on a wafer 1 and a clamping device 3 is used to secure the relative position of the planar plate 2 and the wafer 1. The clamping device includes a base 31, clamping portions 32, pressure cylinders 33, and air supply tubes 34. The air supply tubes 34 are used to control entry of air into the pressure cylinders 33 so that the clamping portions 32 above press downwardly to secure the planar plate 2 and the wafer 1. Such device may utilize the air flow to control the clamping portions 32 to exert a pressure on the planar plate 2 and the wafer 1 so as to exert a suitable clamping force on wafers of varying strength. Use of a simple clamping tool to secure the planar plate 2 and the wafer 1 overlooks the importance of controlling the clamping force. Such clamping device may lead to interference of a non-positive force due to improper application of force, so that displacement occurs between the planar plate 2 and the wafer 1. If the force exerted by the clamping portions at the sides is not uniform, slanting may result and the planar plate 2 and the wafer 1 cannot be properly positioned. Besides, the step of precision positioning becomes a waste of effort. Therefore, trying to secure wafers by pressure application is not ideal.

SUMMARY OF THE INVENTION

The present invention relates generally to a wafer securing device and method, and more particularly to a wafer securing device and method utilizing vacuum suction force to secure a planar plate on a wafer.

A first object of the present invention is to provide a wafer securing device to eliminate the problem of displacement during the step of securing a planar plate on a wafer.

A second object of the present invention is to provide a wafer securing method to eliminate the problem of displacement during the step of securing a planar plate on a wafer.

A third object of the present invention is to provide a method of adhering a jet-containing plate of an ink jet head to positively secure the jet-containing plate to facilitate subsequent procedures.

According to the above-mentioned first object of the present invention, the present invention provides a wafer securing device for securing a planar plate on a wafer which has a hollowed-out portion, the device including a substrate for receiving the wafer; a groove provided on the substrate and having an opening, the hollowed-out portion corresponding to the groove when the wafer isjplaced on the substrate; and an air extracting equipment for extracting air from the groove when the wafer is placed on the substrate so that the planar plate placed on the wafer is adhered thereto by means of a vacuum suction force.

According to the above-mentioned first object of the present invention, the groove may have any shape. For instance, it may be an elongate or annular groove.

According to the above-mentioned first object of the present invention, the groove has a pressure preferably lower than the ambient pressure by 50–200 mmHg after air is extracted from the groove.

According to the above-mentioned first object of the present invention, the wafer securing device further comprises a double valve connected in between the air extracting equipment and the opening. When it is desirable to form the vacuum suction force, the double valve communicates with the opening and the air extracting equipment so that air is extracted from the groove. When it is desirable to remove the vacuum suction force, the double valve communicates with the opening and the ambient air so that the ambient air flows back into the groove to remove the vacuum.

According to the above-mentioned first object of the present invention, the groove of the wafer securing device further includes a closable opening. When it is desirable to form a vacuum suction force, the closable opening is kept in a closed state so that air may be extracted from the groove. But when it is desirable to remove the vacuum suction force, the closable opening is put in an opened state so that the ambient air flows back into the groove to proceed with removal of the vacuum.

According to the above-mentioned first object of the present invention, said wafer securing device may include a plurality of grooves, each groove having an independent opening, and the wafer further includes a plurality of hollowed-out portions such that all or some of the hollowed-out portions correspond to the grooves when the wafer is placed on the substrate.

According to the second object of the present invention, the wafer securing method for securing a planar plate on a wafer having a hollowed-out portion, the method comprising: placing the wafer on a substrate having a groove such that the hollowed-out portion of the wafer corresponds to the groove of the substrate; aligning the planar plate with the wafer and placing said planar plate on the wafer; and extracting air inside the groove so that the planar plate is secured on the wafer by means of a vacuum suction force.

According to the above-mentioned second object, the wafer securing method of the present invention further comprises the step of coating an adhesive between the planar plate and the wafer.

According to the above-mentioned second object, the wafer securing method of the present invention further comprises the step of removing the vacuum to allow the air to flow back into the groove to remove the vacuum suction force between the planar plate and the wafer after the step of extracting air from the groove.

According to the above-mentioned wafer securing method of the present invention, the pressure in the groove after air extraction is lower than the ambient pressure by 50–200 mmHg.

According to the above-mentioned wafer securing method of the present invention, the substrate further includes a plurality of grooves each of which has an independent opening so that each groove may undergo independent air extraction in response to the strength of the planar plate at different positions or places, the grooves having different degrees of vacuum after air extraction.

According to the third object of the present invention, a method of adhering a jet-containing plate of an ink jet head is provided. The ink jet head includes a plate containing a plurality of ink jets to eject ink, and a chip to control the ejection of ink, the chip having a hollowed-out portion for containing the ink. The method comprises the steps of placing the chip on a substrate having a groove such that the hollowed-out portion of the chip corresponds to the groove of the substrate; coating a layer of adhesive on the chip; aligning the jet-containing plate with the chip and placing the jet-containing plate on the chip; heating the layer of adhesive so that the adhesive binds the jet-containing plate and the chip together; and removing the vacuum so that the air flows back into the groove to remove the vacuum suction force between the jet-containing plate and the chip.

DETAILED DESCRIPTION OF THE PREFERRED EMBODIMENT

Figure 1:
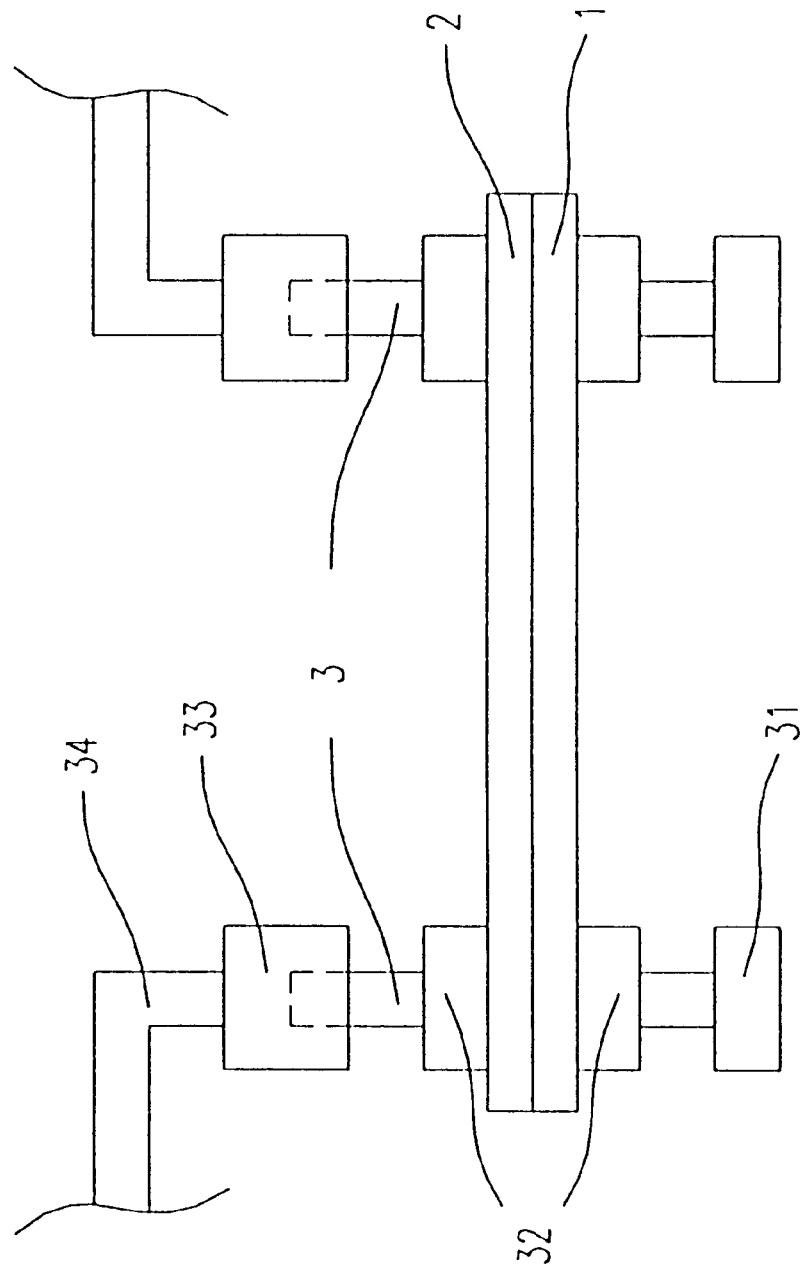
FIG. 1 is a schematic view of a wafer securing method of the prior art.
Figure 2:
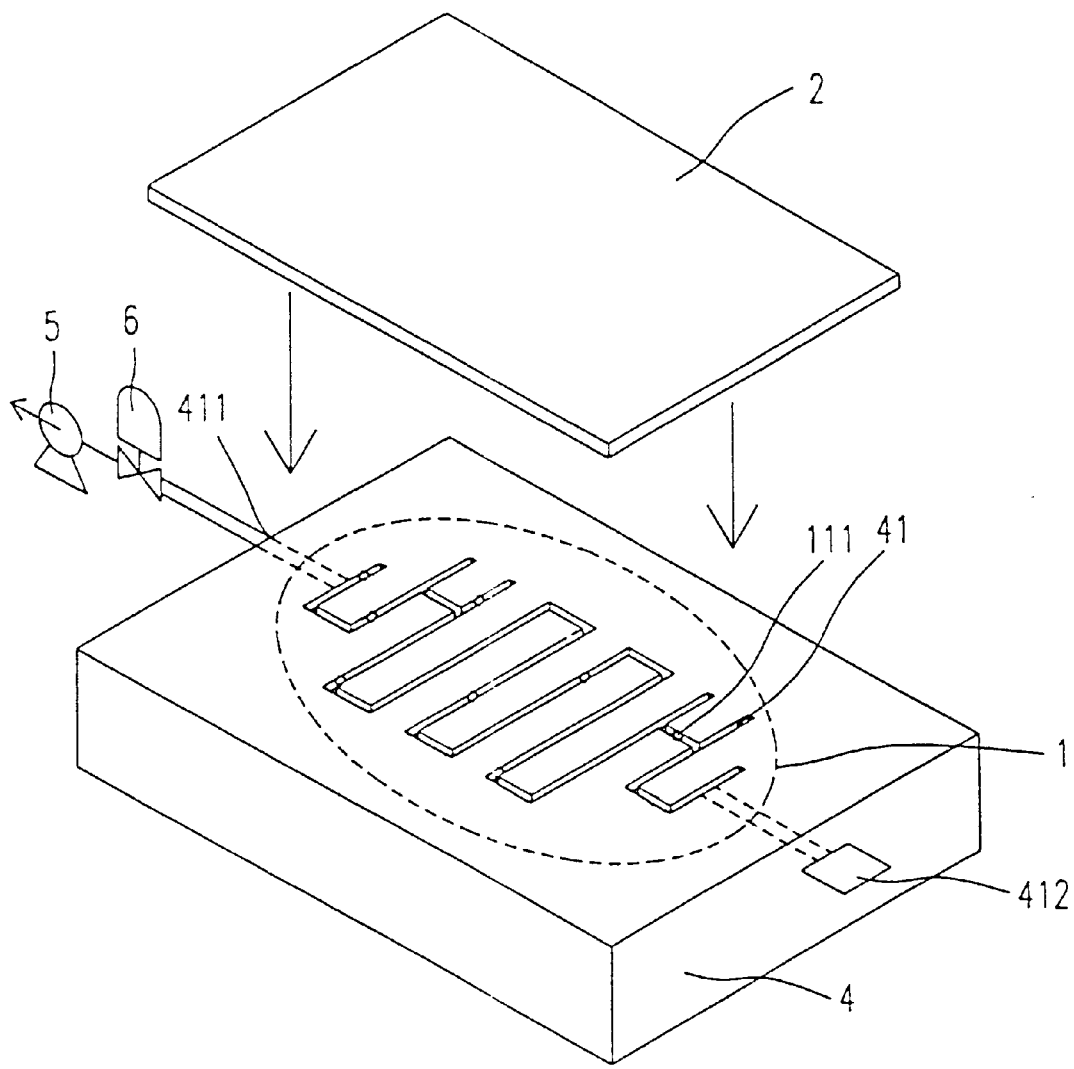
FIG. 2 is a schematic view of a preferred embodiment of the wafer securing device of the present invention.

With reference to FIG. 2, which is a schematic view of a wafer securing device according to a preferred embodiment of the present invention, a planar plate 2 and a wafer 1 are together placed on a substrate 4. The wafer 1 has a plurality of hollowed-out portions 111, which just match a winding elongate groove 41 on the substrate 4. The groove 41 has an opening 411 connected to an air extracting equipment 5, which may be a conventional vacuum pump such as a rotary pump. At the same time, a double valve 6 may be disposed intermediate the air extracting equipment 5 and the opening 411, or the groove 41 may have a closable opening 412. This double valve 6 or the closable opening 412 is used to determine the formation or removal of vacuum suction. Take the double valve 6 as an example. When it is desired to secure the planar plate 2 and the wafer 1, the double valve 6 is caused to communicate with both the opening 411 and the air extracting equipment 5. Therefore, the air extracting equipment 5 may draw out the air inside the groove 41 to create a vacuum. The pressure within the groove 41 should be lower than the ambient pressure by about 50–200 mmHg. The formation of this vacuum will generate an attracting force on the planar plate 1 above via the hollowed out portions 111 of the wafer 1. When the difference between the pressure inside and the pressure outside is great, it indicates that the vacuum suction force is great. Conversely, when the difference is small, the vacuum suction force is small. Therefore, the strength or other factors of the planar plate 2 may be based upon to determine the air extraction rate of the air extracting equipment 5. Different vacuum suction requirements may be easily determined by changing the air extraction rate. But it should be noted that the planar plate 2 right above the hollowed-out portions 111 of the wafer 1 must not be hollowed out. Otherwise, it will only be a waste of the function of the air extracting equipment 5 and it is not possible to secure the planar plate 2 and the wafer 1. After the other steps have been completed, the vacuum suction force on the planar plate 2 has to be removed. At this point, the double valve 6 will turn to communicate with the opening 411 and the atmosphere, so that the ambient air starts flowing back into the groove 41. The vacuum suction force hence becomes smaller until it finally vanishes. Now take the closable opening 412 as an example. When it is desirable to form a vacuum, the closable opening 412 should be in a closed state so that the air extraction equipment 5 may draw out air inside the groove 41 to keep the groove 41 in a vacuum state. When it is desirable to remove the vacuum suction force, the closable opening 412 is kept in an opened state so that the ambient air may flow back into the groove 41 to remove the vacuum.

Certainly, it is not necessary to have each hollowed-out portion 111 correspond to the groove 41. Some of them may lie close against the substrate 4, which will not affect the formation of the vacuum.

Figure 3:
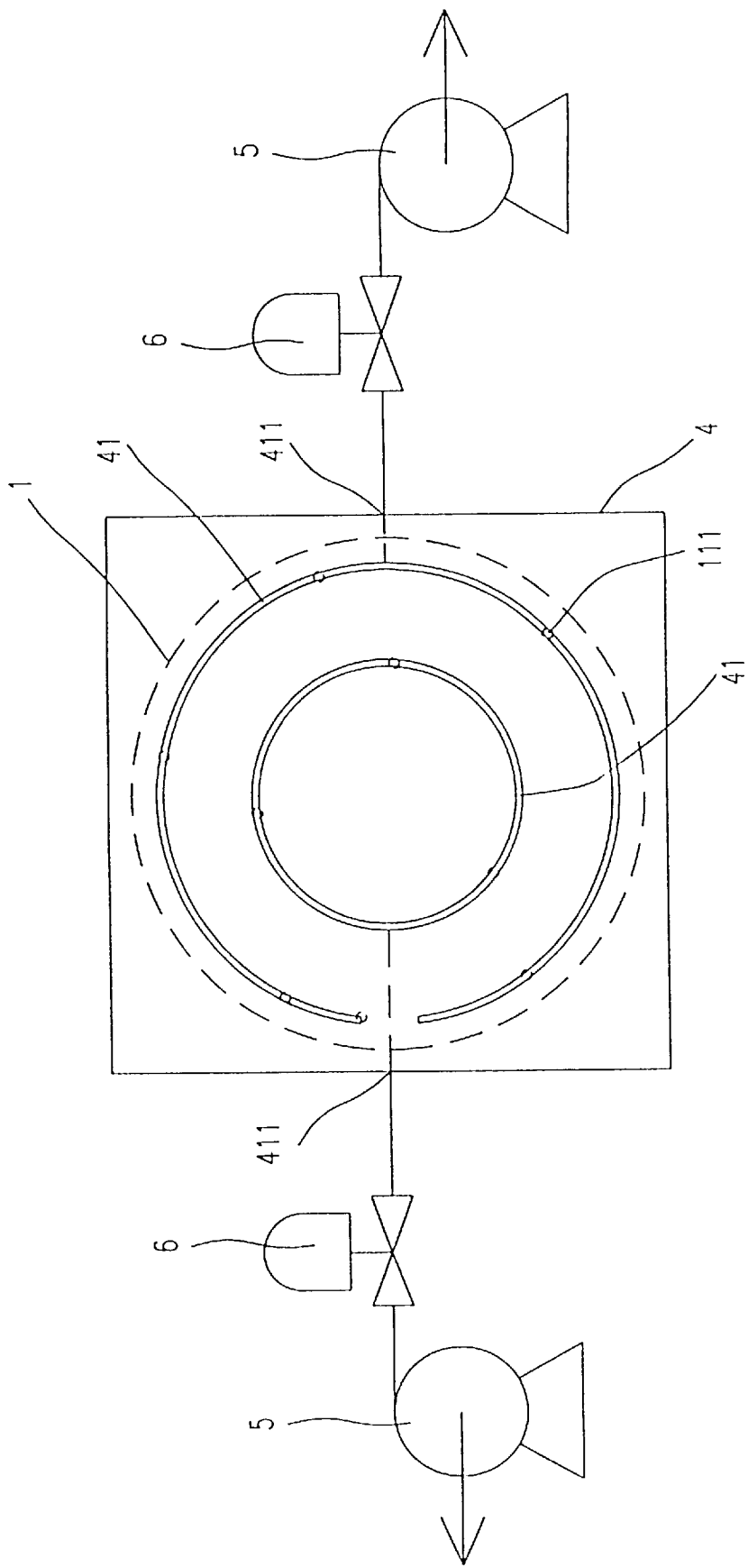
FIG. 3 is top view of another preferred embodiment of the wafer securing device of the present invention.

Referring to FIG. 3, which is a top view of the wafer securing device according to another preferred embodiment of the present invention, the substrate 4 in this embodiment may further include a plurality of non-communicating grooves 41, each of which has an independent opening 411 and corresponds to its own valve 6 and air extraction equipment 5. When the strength of the planar plate 2 is not uniform, with some places weaker and some places tougher, the degree of vacuum of the grooves 41 may be adjusted to match the strength of the planar plate 2 at different places. In other words, different grooves 41 will create different vacuum suction forces. In this way, the vacuum suction force at each position or place may be adjusted to an optimal value. Besides, the planar plate 2 will not easily crack under excessively strong vacuum suction force or poorly secured due to weak vacuum suction force. In addition, the shape of the grooves 41 may vary depending on actual needs. In this embodiment, the grooves 41 are annular whereas the grooves in the first embodiment are elongate, both of which may be adapted for use in semi-conductor manufacturing processes.

Compared to the conventional method of using clamping pressure, the present invention employing suction force to secure the wafer on the substrate has improved effects and eliminates the problem of displacement as with the prior art. So long as the planar plate and the wafer are precisely positioned on the substrate, when the degree of vacuum in the grooves has reached a certain requirement, the planar plate will be firmly secured on the wafer, without any interference of a non-positive force which generates a shearing force on the planar plate, as in the prior art. Furthermore, the arrangement of the grooves allows even distribution of the vacuum suction force on the planar plate, unlike the prior art wherein stress is created at the clamping point. Therefore, it can be appreciated that even slight deformation will not occur in the present invention.

Such securing technique may be applied in many semi-conductor manufacturing processes, such as the making of the ink jet heads. Referring to FIG. 3, which is a schematic view illustrating the structure of a third preferred embodiment of the present invention, the main body of an ink jet head is a chip 1 which includes circuits cortrollable by software to eject ink. The middle of the chip 1 is provided with a hollowed-out portion 111 for containing all the ink 113. A plurality of ink grooves 112 are provided around the hollowed-out portion 111 and may communicate therewith so that ink 113 may flow into the grooves 112. The ink grooves 112 are then covered by a jet-containing plate 21 provided with multiple ink jets such that each ink groove 112 corresponds to one ink jet 211 to serve as an outlet for the ink 113.

Figure 4:
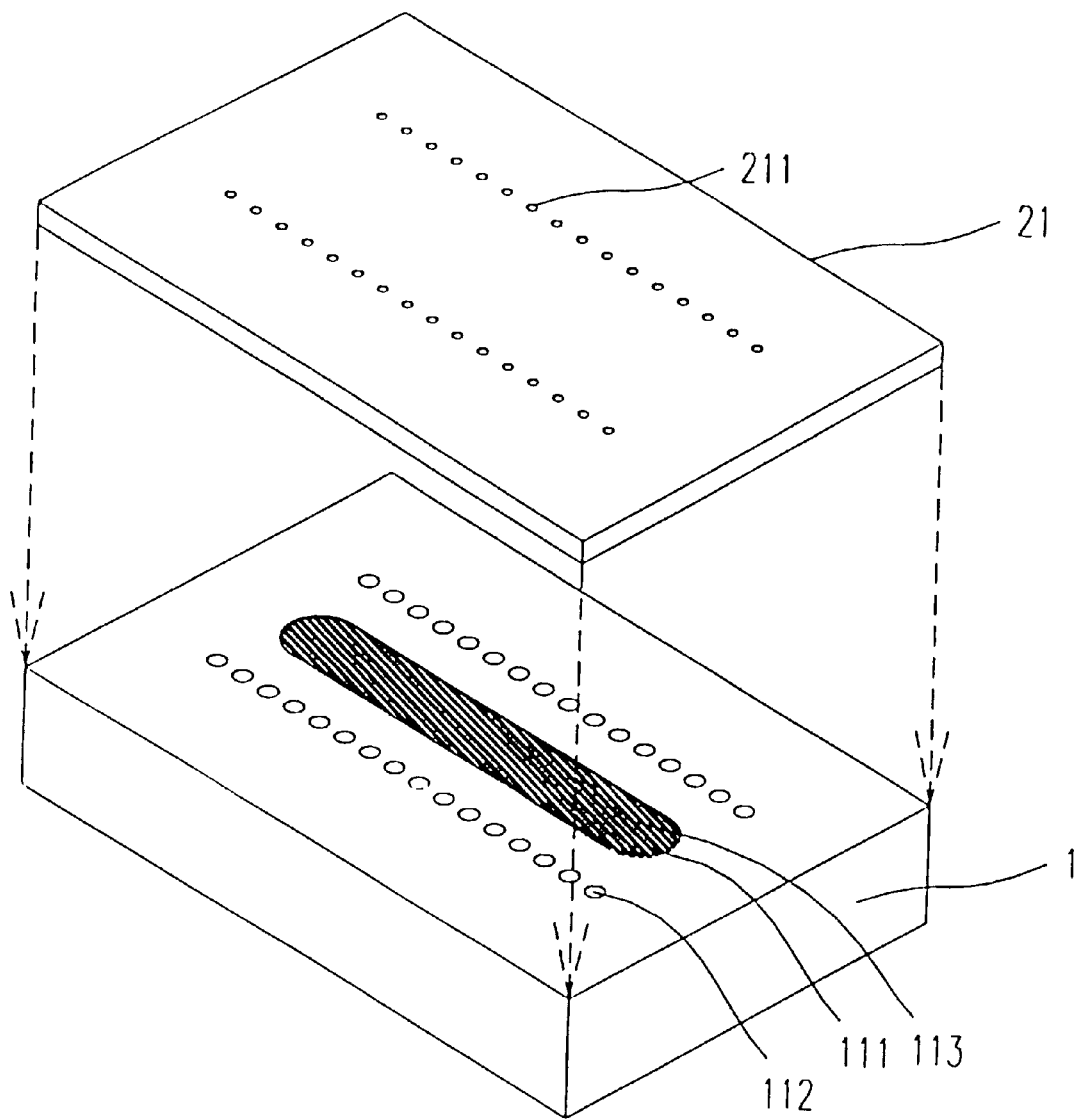
FIG. 4 is a schematic view illustrating the structure of the ink jet head of yet another preferred embodiment of the present invention.
Figure 5:
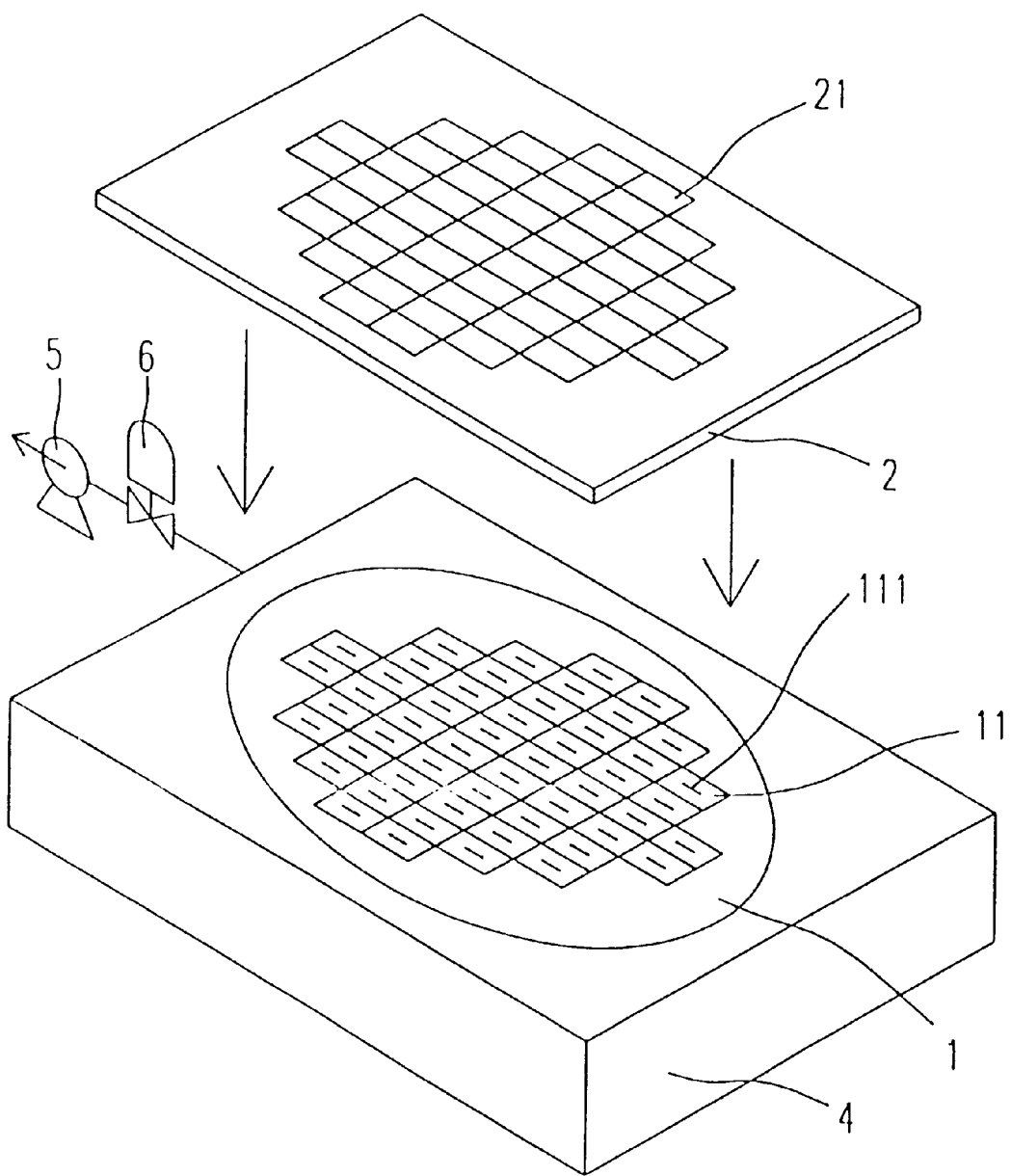
FIG. 5 is a schematic view of applying the securing device to the structure of FIG. 4.

Referring to FIG. 5, which shows the securing device of the present invention used in the structure of FIG. 4, when it is desirable to adhere a planar plate 2 including tens of jet-containing plates to a wafer 1 including tens of chips 11, the wafer 1 is firstly placed on a substrate 4 with some of the hollowed-out portions 111 aligning with the grooves 41. Then the wafer 1 is coated with a layer of adhesive, and the planar plate 2 placed on the wafer 1 by precision positioning. The air extracting equipment 5 is then actuated to form a vacuum in each groove 41, generating a vacuum suction force on the planar plate 2, which is thus secured on the wafer 1 in a stable manner. Next, the planar plate 2 and the wafer 1 are both transferred to parallel plates where they are heated and pressured to adhere the planar plate 2 to the wafer 1. After the planar plate 2 has been adhered to the wafer 1, the double valve 6 may be operated to allow the ambient air to flow into the grooves 41. Adhering the planar plate 2 to the wafer 1 is thus accomplished.

In summary, the wafer securing device and method provided by the present invention are new. The device is simple in construction and easy to operate. The present invention may be adapted for use in many semi-conductor manufacturing processes. Besides, it eliminates the drawbacks with the prior art.

Although the present invention has been illustrated and described with reference to the preferred embodiment thereof, it should be understood that it is in no way limited to the details of such embodiment but is capable of numerous modifications within the scope of the appended claims.

I claim:

1. A wafer securing device for securing a planar plate on a wafer, said wafer having a hollowed-out portion, said wafer securing device comprising:

a substrate for receiving said wafer;

a groove provided on said substrate and having an opening, said hollowed out portion corresponding to said groove when said wafer is placed on said substrate; and an air extracting equipment adapted to draw out air in said groove via said opening of said groove when said wafer is placed on said substrate such that said planar plate placed on said wafer is secured on said wafer by a vacuum suction force.

2. The wafer securing device as claimed in claim 1, wherein said groove is a winding elongate groove.

3. The wafer securing device as claimed in claim 1, wherein said groove is an annular groove.

4. The wafer securing device as claimed in claim 1, wherein the pressure in said groove after air extraction is lower than the ambient pressure by 50–200 mmHg.

5. The wafer securing device as claimed in claim 1, further comprising a double valve connected in between said air extracting equipment and said opening, said double valve communicating with both of said opening and said air extracting equipment when air is extracted from said groove, thereby forming said vacuum suction force, and said double valve communicating with said opening and the surroundings when the ambient air flows back into said groove, thereby removing said vacuum suction force.

6. The wafer securing device as claimed in claim 1, wherein said groove further has a closable opening which is in a closed state when air is drawn out from said groove to form said vacuum suction force and is in an opened state when the ambient air flows back into said groove to remove said vacuum suction force.

7. The wafer securing device as claimed in claim 1, further comprising a plurality of grooves each of which is provided with an independent opening, and said wafer further includes a plurality of hollowed-out portions which correspond to said plurality of grooves when said wafer is placed on said substrate.

* * * * *